United States Patent
Jeong

(10) Patent No.: US 10,026,799 B2
(45) Date of Patent: Jul. 17, 2018

(54) DISPLAY APPARATUS

(71) Applicant: SAMSUNG DISPLAY CO., LTD., Yongin-si, Gyeonggi-do (KR)

(72) Inventor: Heesoon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 15/084,316

(22) Filed: Mar. 29, 2016

(65) Prior Publication Data

US 2017/0069702 A1   Mar. 9, 2017

(30) Foreign Application Priority Data

Sep. 9, 2015   (KR) .......................... 10-2015-0127856

(51) Int. Cl.
*G09G 3/30* (2006.01)
*H01L 27/32* (2006.01)
*G04C 17/00* (2006.01)

(52) U.S. Cl.
CPC .......... *H01L 27/3276* (2013.01); *G04C 17/00* (2013.01); *H01L 27/326* (2013.01)

(58) Field of Classification Search
CPC ............. H01L 27/3276; H01L 51/5056; H01L 51/5092; H01L 51/5072; H01L 51/5012; H01L 51/5221; H01L 51/5088; H01L 51/5206; H01L 27/3246; H01L 27/3262; H01L 27/3265; G09G 3/3266; G09G 2300/0465; G09G 2300/02; G09G 2300/0426; G09G 3/3291
See application file for complete search history.

(56) References Cited

U.S. PATENT DOCUMENTS

| 2008/0266210 | A1* | 10/2008 | Nonaka | G09G 3/20 345/55 |
| 2012/0176427 | A1* | 7/2012 | Zhao | G09G 3/3611 345/694 |
| 2015/0323906 | A1* | 11/2015 | Yang | G04G 9/0017 368/224 |
| 2016/0071451 | A1* | 3/2016 | Yang | G09G 3/2092 345/204 |

FOREIGN PATENT DOCUMENTS

| JP | 2006-276580 A | 10/2006 |
| JP | 2007-114569 A | 5/2007 |
| JP | 2008-216894 A | 9/2008 |
| JP | 2009-069768 A | 4/2009 |
| KR | 10-2009-0059661 | 6/2009 |
| KR | 10-2014-0086708 | 7/2014 |
| KR | 10-2015-0012143 | 2/2015 |

* cited by examiner

*Primary Examiner* — Adam R Giesy
(74) *Attorney, Agent, or Firm* — Lewis Roca Rothgerber Christie LLP

(57) ABSTRACT

A display apparatus includes: a plurality of first scan lines which extend in a radial direction; a plurality of second scan lines between adjacent first scan lines of the plurality of first scan lines which are adjacent to each other; a plurality of data lines which extend in a circular direction and intersect with the first and second scan lines; and a plurality of pixels in an area partitioned by the first scan lines, the second scan lines, and the data lines, the plurality of pixels being connected to the first scan lines, the second scan lines, and the data lines.

15 Claims, 5 Drawing Sheets

DISPLAY APPARATUS

CROSS-REFERENCE TO RELATED APPLICATION

This application claims priority to and the benefit of Korean Patent Application No. 10-2015-0127856, filed on Sep. 9, 2015 in the Korean Intellectual Property Office, the entire content of which is hereby incorporated by reference.

BACKGROUND

1. Field

Aspects of embodiments of the present disclosure relate to a display apparatus.

2. Description of the Related Art

A variety of display apparatuses such as a liquid crystal display (LCD), an organic light-emitting display (OLED), an electrowetting display device, a plasma display panel (PDP), an electrophoretic display device, and the like have been developed as display apparatuses.

Such display apparatuses may have a quadrangular shape by including a display panel having a quadrangular shape. A display apparatus having a quadrangular shape includes a plurality of gate lines (or scan lines) that extend in a row direction, a plurality of data lines that extend in a column direction, and a plurality of pixels connected to the gate and data lines.

Recently, display apparatuses having a variety of shapes, as well as a quadrangular shape, have been developed in accordance with increasing use of display apparatuses.

SUMMARY

According to an aspect of embodiments of the present disclosure, a display apparatus has a circular shape and a reduced bezel area.

According to one or more embodiments of the present invention, a display apparatus includes: a plurality of first scan lines which extend in a radial direction; a plurality of second scan lines between adjacent first scan lines of the plurality of first scan lines which are adjacent to each other; a plurality of data lines which extend in a circular direction and intersect with the first and second scan lines; and a plurality of pixels in an area partitioned by the first scan lines, the second scan lines, and the data lines, the plurality of pixels being connected to the first scan lines, the second scan lines, and the data lines.

In an embodiment, the second scan lines may extend to be parallel with one of the adjacent first scan lines, and respective lengths of the second scan lines may decrease in a direction toward the other one of the adjacent first scan lines.

In an embodiment, the display apparatus may further include a display panel having a circular shape and on which the first and the second scan lines, the data lines, and the pixels are arranged.

In an embodiment, an area in a plane of the display panel may include a first non-display area in a central region of the display panel, a second non-display area in an outer region of the display panel, and a display area in which the pixels are arranged, and the display area may be between the first and second non-display areas.

In an embodiment, a number of pixels in the display area may increase in a direction toward the second non-display area.

In an embodiment, the display apparatus may further include a first scan driver in the first non-display area and connected to the first scan lines, a second scan driver in the second non-display area and connected to the second scan lines, and a data driver on a rear surface of the display panel and connected to the data lines.

In an embodiment, the first and second scan drivers may apply a plurality of scan signals to the first and second scan lines, and the data driver may apply a plurality of data voltages to the data lines.

In an embodiment, the pixels may receive the data voltages in response to the scan signals, and include organic light-emitting elements for displaying an image corresponding to the received data voltages.

In an embodiment, the display apparatus may further include a plurality of first pads corresponding to the data lines. One side of each of the data lines may be connected to a corresponding first pad of the plurality of first pads, and another side of each of the data lines may be adjacent to the corresponding first pad.

In an embodiment, the display apparatus may further include a plurality of second pads on the rear surface of the display panel and connected to the first pads, and a plurality of connection lines on the rear surface of the display panel and connecting the second pads to the data driver.

In an embodiment, the display panel may further include a first substrate including a plurality of via-holes overlapping the first and second pads to electrically connect the first and second pads to each other through the via-holes.

BRIEF DESCRIPTION OF THE DRAWINGS

The accompanying drawings are included to provide a further understanding of the inventive concept, and are incorporated in and constitute a part of this specification. The drawings illustrate some exemplary embodiments of the inventive concept and, together with the description, serve to explain principles of the inventive concept. In the drawings.

DETAILED DESCRIPTION

Figure 1:
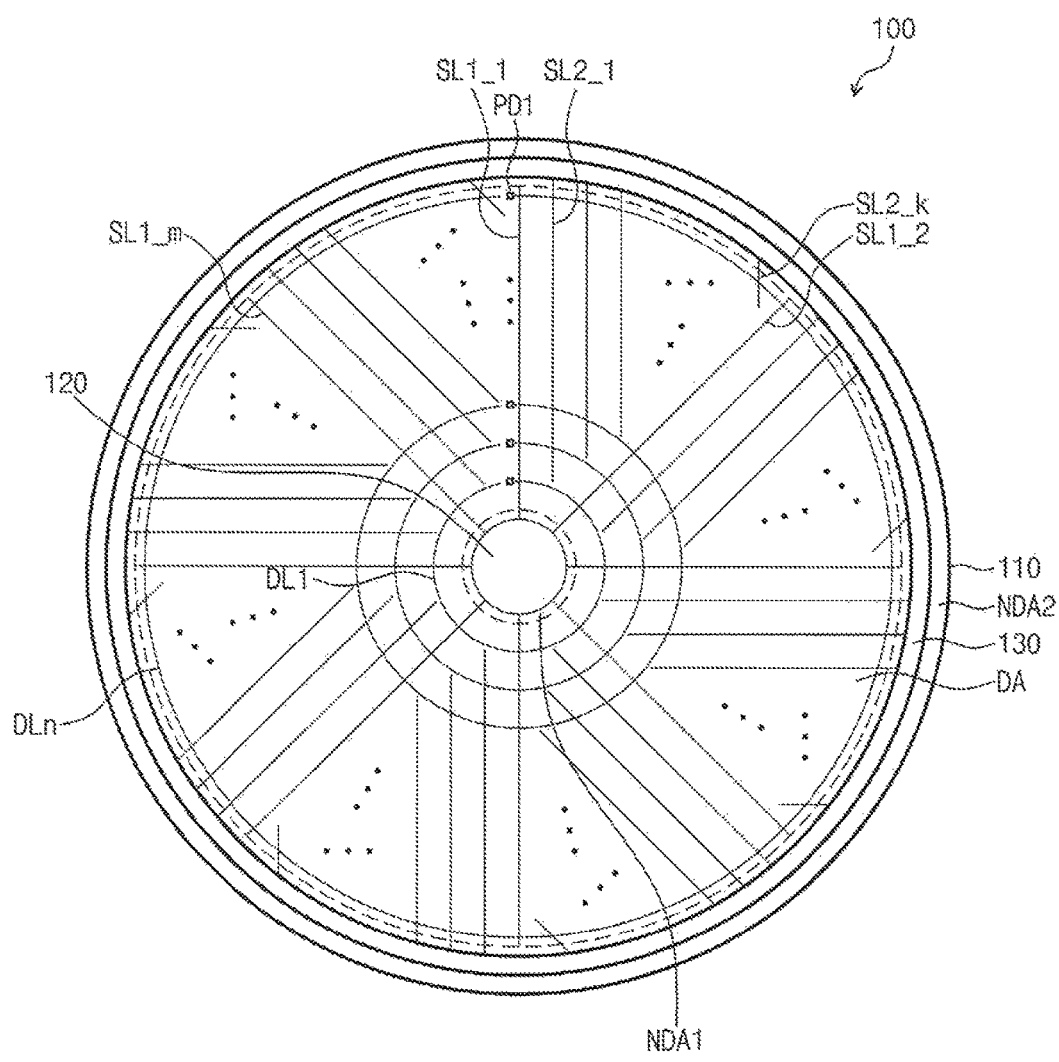
FIG. 1 is a top view of a display apparatus according to an embodiment of the inventive concept.

Aspects and features of the present disclosure, and implementation methods thereof, will be clarified through the following description of some exemplary embodiments with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Like reference numerals refer to like elements throughout.

It is to be understood that when an element or layer is referred to as being "on" or "connected to" another one, it can be directly on the other one, or one or more intervening elements or layers may also be present. On the other hand, it will be understood that when an element is referred to as being "directly disposed on" or "directly connected to" another one, another element is not present therebetween. As used herein, the term "and/or" includes any and all combinations of one or more of the associated listed items.

Spatially relative terms such as "below," "beneath," "lower," "above," "upper," or the like may be used to describe a relationship between one element or component and another element or component as illustrated in the drawings. It should be understood that the spatially relative terms include orientations of constituent elements in action that are different from each other in addition to the orientations illustrated in the drawings.

Although terms such as "first" and "second" may be used to describe various elements, components, and/or sections in various embodiments of the inventive concept, the elements, components, and/or sections are not limited thereto. These terms are used only to differentiate one element, component, or section from another one. Accordingly, it will be apparent that a first element, a first component, or a first section described hereinafter may refer to a second element, a second component, or a second section within the scope of the inventive concept.

Embodiments in the following description will be described with plain view and sectional views as ideal exemplary views of the disclosure. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Areas exemplified in the drawings have general properties, and may be used to illustrate a specific shape of a semiconductor package region. Thus, this should not be construed as limiting the scope of the present invention.

Hereinafter, some exemplary embodiments of the inventive concept will be described in further detail with reference to the accompanying drawings.

Figure 2:
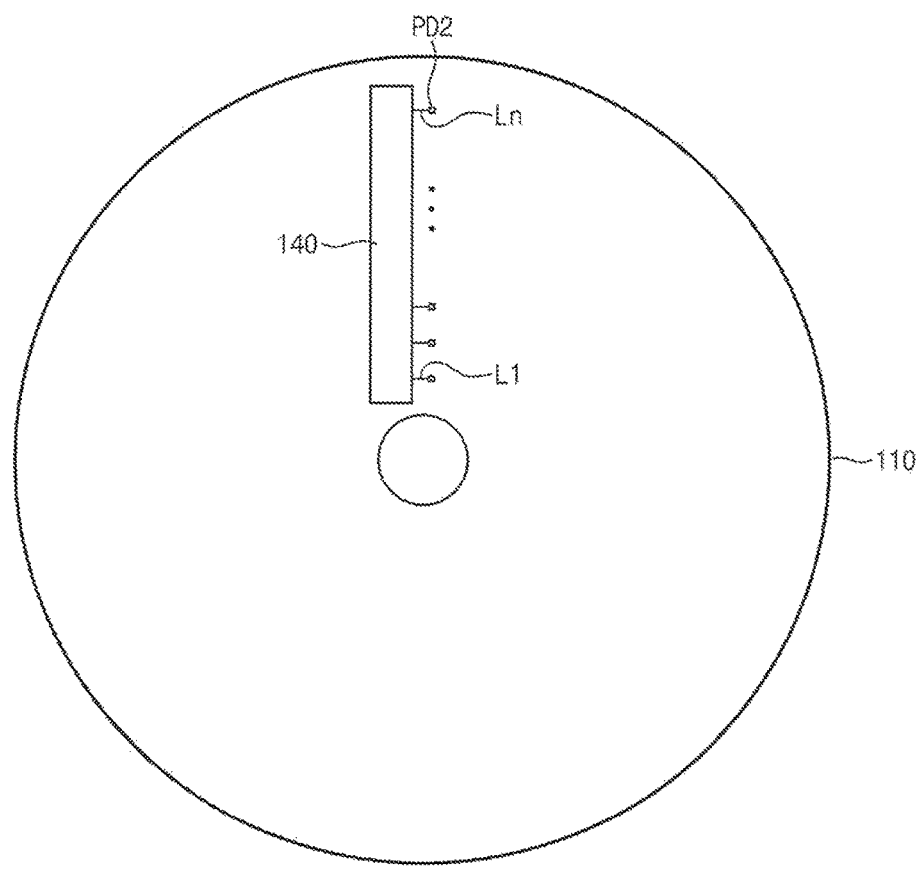
FIG. 2 is a bottom view of a display apparatus according to an embodiment of the inventive concept.
Figure 3:
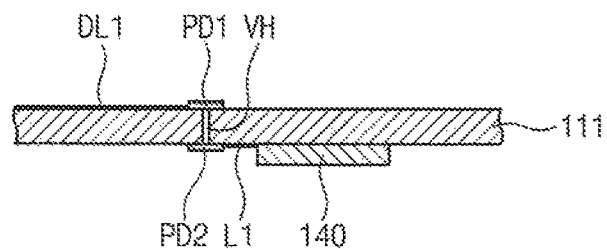
FIG. 3 is a partial cross-sectional view of the display apparatus of FIG. 1 illustrating connections between first pads illustrated in FIG. 1 and second pads illustrated in FIG. 2.

FIG. 1 is a top view of a display apparatus according to an embodiment of the inventive concept. FIG. 2 is a bottom view of the display apparatus according to an embodiment of the inventive concept. FIG. 3 is a partial cross-sectional view of the display apparatus of FIG. 1 to describe connections between first pads illustrated in FIG. 1 and second pads illustrated in FIG. 2.

Hereinafter, the top of a display apparatus 100 is referred to as a front surface of the display apparatus 100, and the bottom of the display apparatus 100 is referred to as a rear surface of the display apparatus 100.

Referring to FIGS. 1 and 2, the display apparatus 100 according to an embodiment of the present invention includes a display panel 110, scan drivers 120 and 130, a data driver 140, a plurality of scan lines SL1_1 to SL1_$m$ and SL2_1 to SL2_$k$, a plurality of data lines DL1 to DLn, a plurality of first pads PD1, and a plurality of second pads PD2. Symbols k, m, and n herein are natural numbers.

The display panel 110 may be an organic light-emitting display panel including an organic light-emitting element, but the present inventive concept is not limited thereto. A variety of display panels such as a liquid crystal display (LCD) including a liquid crystal layer, an electrowetting display panel including an electrowetting layer, and an electrophoretic display panel including an electrophoretic layer may be used as the display panel 110.

The display panel 110 has a circular shape. An area of the display panel 110 as viewed in a plane includes a first non-display area NDA1 disposed in a predetermined central region of the display panel 110, a display area DA disposed so as to surround the first non-display area NDA1, and a second non-display area NDA2 disposed so as to surround the display area DA.

The second non-display area NDA2 is disposed in a predetermined outer area of the display panel 110. Thus, the display area DA is disposed between the first non-display area NDA1 and the second non-display area NDA2.

The display area DA may be defined as an area where an image is displayed. The first and the second non-display areas NDA1 and NDA2 are areas where an image is not displayed, and may be defined as non-display areas NDA1 and NDA2.

The scan drivers 120 and 130 are disposed in the non-display areas NDA1 and NDA2 of the display panel 110 to output a plurality of scan signals.

The scan drivers 120 and 130 include a first scan driver 120 disposed in the first non-display area NDA1 of the display panel 110 and a second scan driver 130 disposed in the second non-display area NDA2 of the display panel 110. The second scan driver 130 may be disposed so as to surround the display area DA of the display panel 110.

The scan lines SL1_1 to SL1_$m$ and SL2_1 to SL2_$k$ are disposed on the display panel 110 to be connected to the scan drivers 120 and 130. Particularly, the scan lines SL1_1 to SL1_$m$ and SL2_1 to SL2_$k$ include a plurality of first scan lines SL1_1 to SL1_$m$ and a plurality of second scan lines SL2_1 to SL2_$k$.

The first scan lines SL1_1 to SL1_$m$ are connected to the first scan driver 120 to extend in a radial shape in an outer direction of the display panel 110. The first scan lines SL1_1 to SL_m are not connected to the second scan driver 130.

The second scan lines SL2_1 to SL2_$k$ are disposed between first scan lines of the first scan lines SL1_1 to SL1_$m$ that are adjacent to each other. The second scan lines SL2_1 to SL2_$k$ may extend to be parallel with any one of the first scan lines that are adjacent to each other, and the lengths of the respective second scan lines SL2_1 to SL2_$k$ arranged between the adjacent first scan lines may decrease along a direction toward the other first scan line of the first scan lines that are adjacent to each other.

In an embodiment, for example, the second scan lines SL2_1 to SL2_$k$ are disposed between the first scan line SL1_1 and the first scan line SL1_2 that are adjacent to each other. The second scan lines SL2_1 to SL2_$k$ may extend to be parallel with the first scan line SL1_1, and the lengths of the respective second scan lines SL2_1 to SL2_$k$ may decrease along a direction closer to the first scan line SL1_2. The second scan lines SL2_1 to SL2_$k$ are connected to the second scan driver 130 but are not connected to the first scan driver 120.

The first scan lines SL1_1 to SL1_$m$ receive scan signals from the first scan driver 120. The second scan lines SL2_1 to SL2_$k$ receive scan signals from the second scan driver 130.

The data lines DL1 to DLn extend in a circular direction to intersect with the first and the second scan lines SL1_1 to SL1_$m$ and SL2_1 to SL2_$k$. The data lines DL1 to DLn extending in the circular direction do not have a closed circular shape, but are disposed such that one side of each of the respective data lines DL1 to DLn is adjacent to the other side. The data lines DL1 to DLn may be disposed spaced apart by a predetermined distance from each other in an outer or radial direction of the display panel 110 from the center of the display panel 110.

In an embodiment, the first pads PD1 are arranged in a single column in an outer or radial direction of the display panel 110 from the center of the display panel 110. The first pads PD1 may be disposed spaced apart by a predetermined distance from each other so as to correspond to the data lines DL1 to DLn.

One side of each of the data lines DL1 to DLn is connected to a corresponding first pad PD1 of the first pads PD1. The other side of each of the data lines DL1 to DLn is disposed adjacent to the corresponding first pad PD1 of the first pads PD1.

The data driver 140 and the second pads PD2 are disposed on the rear surface of the display panel 110. The second pads PD2 are disposed so as to correspond to the first pads PD1. Each of the second pads PD2 may be disposed so as to overlap or substantially overlap a corresponding first pad PD1 of the first pads PD1.

The second pads PD2 are disposed so as to correspond to a plurality of connection lines L1 to Ln disposed on the rear surface of the display panel 110, and the second pads PD2 may be connected to the data driver 140 through the connection lines L1 to Ln.

Referring to FIG. 3, the display panel 110 includes a base substrate 111, and the data driver 140, the second pads PD2, and the connection lines L1 to Ln are disposed on a bottom of the base substrate 111. The data lines DL1 to DLn and the first pads PD1 are disposed on a top of the base substrate 111.

For purposes of explanation, the first pad PD1 connected to the first data line DL1 of data lines DL1 to DLn, and the second pad PD2 connected to the first connection line L1 of connection lines L1 to Ln are illustrated in FIG. 3. Although insulating layers may be disposed on the base substrate 111, and the data lines DL1 to DLn may be disposed on the insulating layers, the insulating layers are not shown in FIG. 3.

Via-holes VH formed penetrating the base substrate 111 are disposed in the base substrate 111. The via-holes VH are disposed so as to overlap the first pads PD1 and the second pads PD2. A conductive substance may be applied in the via-holes VH to allow the first pads PD1 and the second pads PD2 to electrically connect to each other.

The first pads PD1 and the second pads PD2 may be electrically connected to each other through the via-holes VH in which the conductive substance is applied. As illustrated in FIG. 3, the first pad PD1 connected to the first data line DL1, and the second pad PD2 connected to the first connection line L1 may be electrically connected to each other through the via-hole VH.

The connection lines L1 to Ln are connected to the data lines DL1 to DLn through the first and second pads PD1 and PD2 connected through the via-holes VH. The data driver 140 outputs a plurality of data voltages.

Although not illustrated, a timing controller may be disposed on the rear surface of the display panel 110. The timing controller outputs image signals, a scan control signal, and a data control signal.

The first and second scan drivers 120 and 130 receive the scan control signal from the timing controller while the data driver 140 receives the image signals and the data control signal from the timing controller. For example, control lines connected to the timing controller may extend to be connected to the first and second scan drivers 120 and 130 and the data driver 140. The image signals, the scan control signal, and the data control signal may be provided to the first and second scan drivers 120 and 130 and the data driver 140 through the control lines.

The scan control signal is a control signal for controlling operation timing of the first and second scan drivers 120 and 130. The data control signal is a control signal for controlling operation timing of the data driver 140.

The first and second scan drivers 120 and 130 generate scan signals in response to the scan control signal to apply the generated scan signals to the first scan lines SL1_1 to SL1_m and the second scan lines SL2_1 to SL2_k.

The data driver 140 generates data voltages corresponding to the image signals in response to the data control signal to apply the generated data voltages to the data lines DL1 to DLn.

Figure 4:
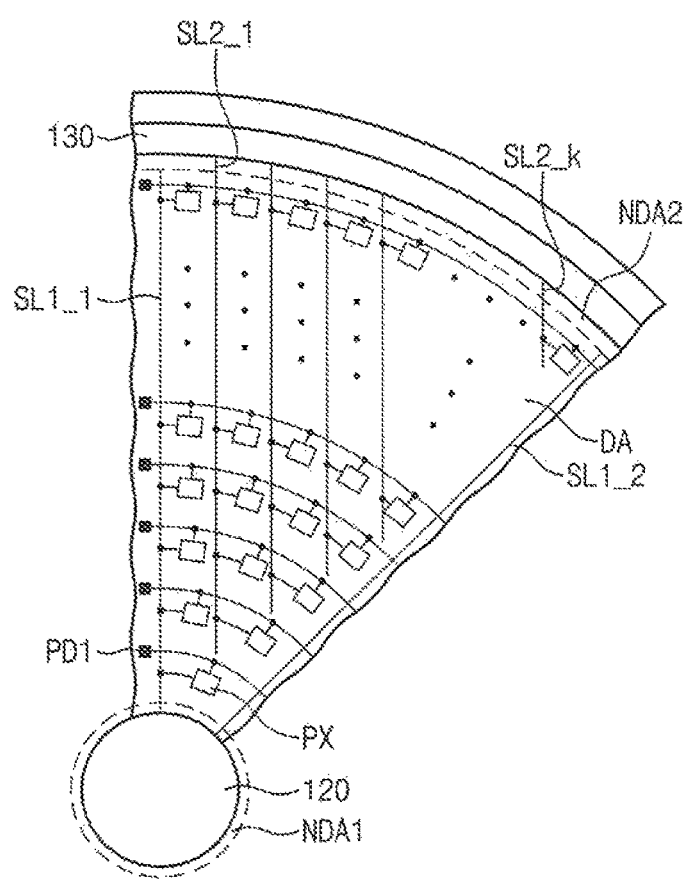
FIG. 4 is a partial top view illustrating pixels disposed in a display panel of the display apparatus of FIG. 1.

FIG. 4 is a partial top view illustrating pixels disposed in the display panel 110.

For purposes of explanation, in FIG. 4, there are illustrated pixels PX disposed between the first scan line SL1_1 and the first scan line SL1_2 which are adjacent to each other, among the first scan lines SL1_1 to SL1_m.

Referring to FIG. 4, a plurality of pixels PX are disposed in the display area DA of the display panel 110. Between the first scan line SL1_1 and the first scan line SL1_2 adjacent to each other, the number of pixels PX in the display area DA increases in a direction closer to the second non-display area NDA2.

Between the first scan line SL1_1 and the first scan line SL1_2 adjacent to each other, the smallest number of pixels PX are disposed in the display area DA adjacent to the first non-display area NDA1 while the largest number of pixels PX are disposed in the display area DA adjacent to the second non-display area NDA2.

It is illustrated in FIG. 4 that the number of pixels PX arranged between the first scan line SL1_1 and the first scan line SL1_2 sequentially increases from 1 to 2, 3, . . . k. However, the inventive concept is not limited thereto. In another embodiment, for example, pixels may be arranged between the first scan line SL1_1 and the first scan line SL1_2 such that the number of pixels increases from 2 to 4, 6, . . . 2k, or increases by any of various numbers.

The pixels PX are disposed in an area partitioned by the first scan lines SL1_1 and SL1_2 and the second scan lines SL2_1 to SL2_k, and the data lines DL1 to DLn.

The pixels PX are connected to the first scan lines SL1_1 and SL1_2 and the second scan lines SL2_1 to SL2_k, and the data lines DL1 to DLn. The pixels PX receive the data voltages through the data lines DL1 to DLn in response to the scan signals provided through the first scan lines SL1_1 and SL1_2 and the second scan lines SL2_1 to SL2_k. The pixels PX display an image corresponding to the data voltages.

In FIG. 4, the pixels PX are disposed between the first scan line SL1_1 and the first scan line SL1_2 adjacent to each other. However, pixels PX disposed between other scan lines which are adjacent to each other but not illustrated in FIG. 4 may also be disposed in the same manner as the pixels PX illustrated in FIG. 4.

In an embodiment of the inventive concept, the pixels are operated by the scan signals and data voltages, but the inventive concept is not limited thereto. The pixels PX may be operated by receiving the scan signals, light emission control signals, and data voltages.

For example, the pixels PX receive the data signals in response to the scan signals, and light emission timing of the pixels PX may be controlled by a light emission control signal. In this case, the first and second scan drivers 120 and 130 may respectively include a light emission control driver outputting the light emission control signal. Also, in an embodiment, the display panel 110 may include first light emission lines which extend in parallel with the first scan lines SL1_1 to SL1_m and second light emission lines which extend in parallel with the second scan lines SL2_1 to SL2_k. The pixels PX may be connected to the first and second light emission lines to receive the light emission control signals.

Figure 5:
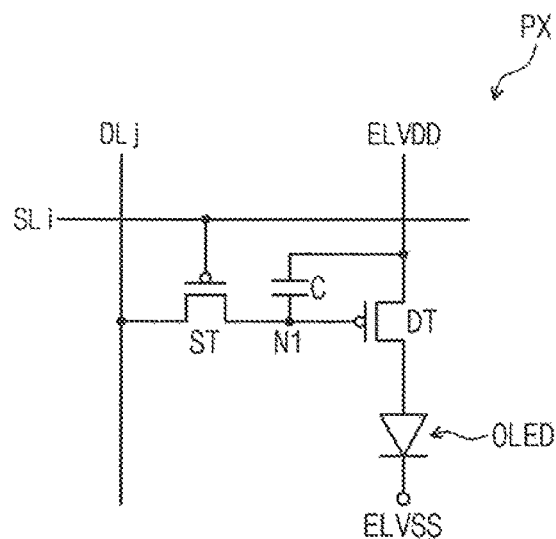
FIG. 5 is a diagram illustrating an equivalent circuit of any one of the pixels illustrated in FIG. 4.
Figure 6:
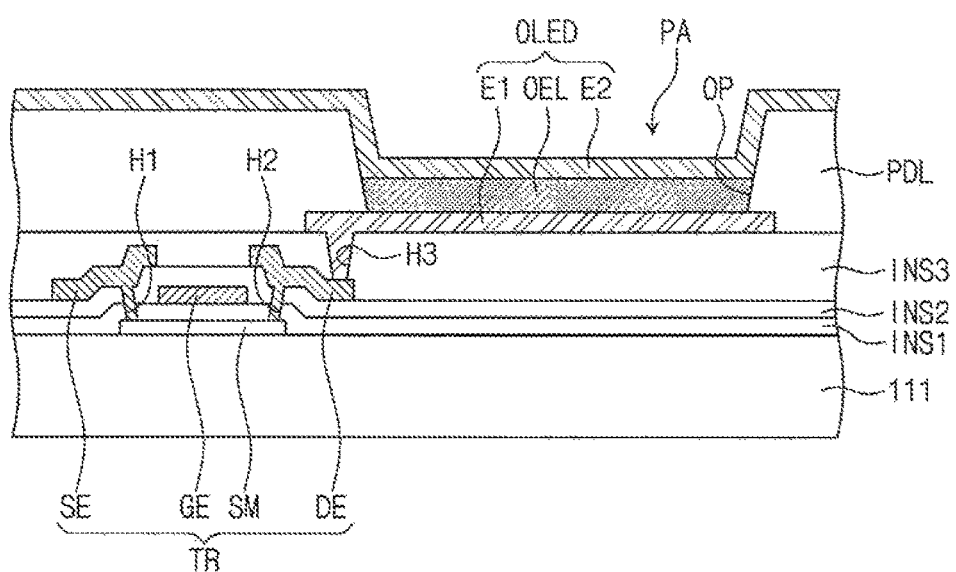
FIG. 6 is a cross-sectional view schematically illustrating a configuration of any one of the pixels illustrated in FIG. 4.

FIG. 5 is a diagram illustrating an equivalent circuit of any one of the pixels PX illustrated in FIG. 4. FIG. 6 is a cross-sectional view schematically illustrating a configuration of any one of the pixels PX illustrated in FIG. 4.

There is illustrated one pixel PX in FIGS. 5 and 6, but other pixels PX may also have the same configuration as the pixel PX illustrated in FIGS. 5 and 6.

Referring to FIG. 5, the pixel PX includes a light-emitting element OLED, a driving element DT, a capacitive element C, and a switching element ST.

The light-emitting element OLED may be an organic light-emitting element including an organic light-emitting layer. The driving element DT and the switching element ST may be P-type transistors, but the inventive concept is not limited thereto. In another embodiment, the driving element DT and the switching element ST may be N-type transistors. The capacitive element C may be a capacitor.

The driving element DT includes an input terminal connected to a first electrode of the capacitive element C and receiving a first power supply voltage ELVDD, an output terminal connected to an input terminal (or an anode electrode) of the light-emitting element OLED, and a control terminal connected to an output terminal of the switching transistor ST.

A second electrode of the capacitive element C is connected to the control terminal of the driving element DT. An output terminal (or a cathode electrode) of the light-emitting element OLED receives a second power supply voltage ELVSS.

The switching element ST includes an input terminal connected to a corresponding data line DLj of the data lines DL1 to DLn, an output terminal connected to the control terminal of the driving element DT, and a control terminal connected to a corresponding scan line SLi among the first and second scan lines SL1_1 to SL1_m and SL2_1 to SL2_k. Herein, i and j are natural numbers.

A scan signal is applied to the control terminal of the switching element ST through the scan line SLi, and the switching element ST is turned on in response to the scan signal. The turned-on switching element ST provides a data voltage received through the data line DLj to a first node N1. The capacitive element C charges the data voltage provided to the first node N1 and maintains the data voltage in a charged state even after the switching element ST is turned off.

The driving element DT is turned on by receiving the charged data voltage from the capacitive element C. The driving element DT may maintain the turned-on state until the charged data voltage in the capacitive element is entirely discharged.

The turned-on driving element DT receives the first power supply voltage ELVDD. Thus, current is supplied to the light-emitting element OLED through the driving element DT to allow the light-emitting element OLED to emit light. An image corresponding to the data voltage may be displayed when the light-emitting element OLED emits light.

Referring to FIG. 6, the pixel PX includes the light-emitting element OLED and a transistor TR connected to the light-emitting element OLED. The light-emitting element OLED may be an organic light-emitting element OLED. In an embodiment, the transistor TR is the driving element DT illustrated in FIG. 5.

The transistor TR is disposed on a base substrate 111. The base substrate 111 may be a glass substrate or a transparent flexible substrate made of plastic or the like. When the base substrate 111 is a flexible substrate, the display panel 110 may be a flexible display panel having flexibility.

A semiconductor layer SM of the transistor TR is disposed on the base substrate 111. The semiconductor layer SM may include an organic semiconductor or an inorganic semiconductor such as amorphous silicon, polycrystalline silicon, or the like. Also, the semiconductor layer SM may include an oxide semiconductor. Although not illustrated in FIG. 6, the semiconductor layer SM may include a source region, a drain region, and a channel region between the source region and the drain region.

A first insulating layer INS1 is disposed on the base substrate 111 so as to cover the semiconductor layer SM. The first insulating layer INS1 may be an inorganic insulating layer including inorganic material. A gate electrode GE of the transistor TR overlapping the semiconductor layer SM is disposed on the first insulating layer INS1. The gate electrode GE may be disposed so as to overlap the channel region of the semiconductor layer SM.

A second insulating layer INS2 is disposed on the first insulating layer INS1 so as to cover the gate electrode GE. The second insulating layer INS2 may be defined as an interlayer insulating layer. The second insulating layer INS2 may be an inorganic insulating layer including an inorganic material.

A source electrode SE and a drain electrode DE of the transistor TR are disposed spaced apart by a predetermined distance from each other on the second insulating layer INS2. The source electrode SE may be connected to the source region of the semiconductor layer SM through a first contact hole H1 formed penetrating the first and second insulating layers INS1 and INS2. The drain electrode DE may be connected to the drain region of the semiconductor layer SM through a second contact hole H2 formed penetrating the first and second insulating layers INS1 and INS2.

A third insulating layer INS3 is disposed on the second insulating layer INS2 so as to cover the source electrode SE and the drain electrode DE of the transistor TR. The third insulating layer INS3 may be an organic insulating layer including an organic material.

A first electrode E1 of the light-emitting element OLED is disposed on the third insulating layer INS3. The first electrode E1 may be connected to the drain electrode DE of the transistor TR through a third contact hole H3 formed penetrating the third insulating layer INS3. The first electrode E1 may be defined as a pixel electrode or an anode electrode. The first electrode E1 may include a transparent electrode or a reflective electrode.

A pixel definition layer PDL configured to expose a predetermined region of the first electrode E1 is disposed on the first electrode E1 and the third insulating layer INS3. The pixel definition layer PDL includes an opening portion OP exposing a predetermined region of the first electrode E1. An area where the opening portion OP is disposed is defined as a pixel area PA.

In the opening portion OP, an organic light-emitting layer OEL is disposed on the first electrode E1. The organic light-emitting layer OEL may include an organic material capable of generating any one of red, green, and blue light.

Thus, the organic light-emitting layer OEL may generate any one of the red, green, and blue light, but the inventive concept is not limited thereto. In another embodiment, the organic light-emitting layer OEL may also generate white light by a combination of organic materials for generating red, green, and blue colors.

The organic light-emitting layer OEL may include a low molecular organic matter or a high molecular organic matter. Although not illustrated, the organic light-emitting layer OEL may be formed as a multi-layer film which includes a hole injection layer HIL, a hole transporting layer HTL, an emission layer EML, an electron transporting layer ETL, and an electron injection layer EIL.

In an exemplary embodiment, the hole injection layer HIL is disposed on the first electrode E1, and the hole transporting layer HTL, the emission layer EML, the electron transporting layer ETL, and the electron injection layer EIL may be sequentially laminated on the hole injection layer HIL.

A second electrode E2 is disposed on the pixel definition layer PDL and the organic light-emitting layer OEL. The second electrode E2 may be defined as a common electrode or a cathode electrode. The second electrode E2 may include a transparent electrode or a reflective electrode.

When the display panel 110 is a top emission type organic light-emitting display panel, the first electrode E1 is defined as a reflective electrode, and the second electrode E2 may be defined as a transparent electrode. When the display panel 110 is a bottom emission type organic light-emitting display panel, the first electrode E1 is defined as the transparent electrode, and the second electrode E2 may be defined as the reflective electrode.

The light-emitting element OLED is defined in the pixel region PA and includes the first electrode E1, the light-emitting layer OEL, and the second electrode E2 in the pixel region PA. The first electrode E1 is an anode which is a hole injection electrode, while the second electrode E2 may be a cathode which is an electron injection electrode.

The first power supply voltage ELVDD for emitting light from the organic light-emitting layer OEL of the OLED by the transistor TR is applied to the first electrode E1, and the second power supply voltage ELVSS of which polarity is opposite to the first power supply voltage ELVDD is applied to the second electrode E2.

In this case, a hole and an electron which are injected in the organic light-emitting layer OEL are bound together to form an exciton. As the exciton falls to a ground state, the light-emitting element OLED emits light. The light-emitting element OLED may emit red, green, and blue light to display predetermined image information in accordance with current flow.

Figure 7:
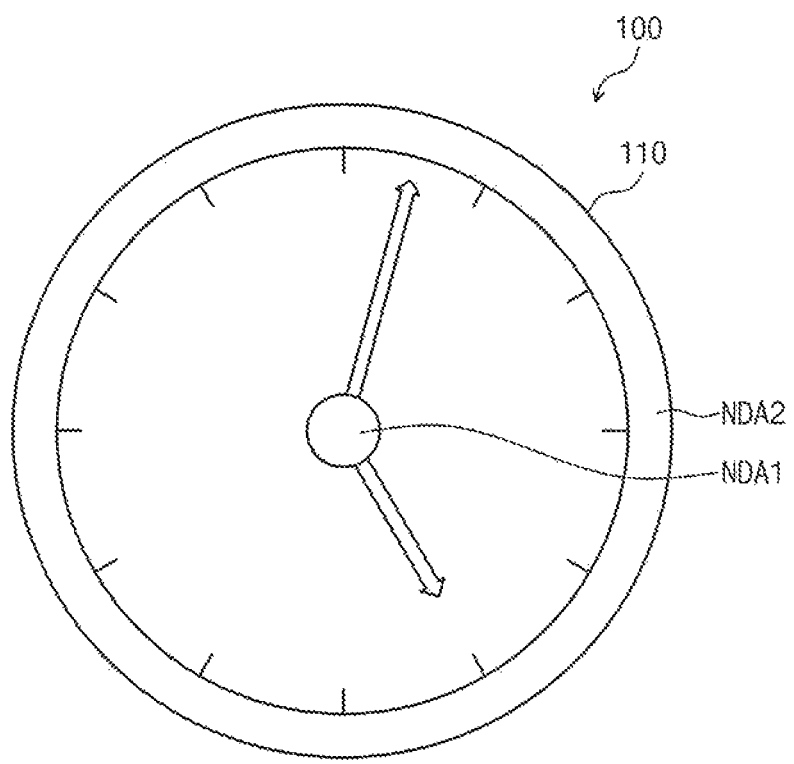
FIG. 7 is a schematic view illustrating an image which may be displayed by the display apparatus of FIG. 1.

FIG. 7 is a schematic view illustrating an image which may be displayed by the display apparatus of FIG. 1.

Referring to FIG. 7, in an embodiment, the display apparatus 100 may display an analog type watch. The first non-display area NDA1 may indicate a central axis of hour and minute hands, and the second non-display area NDA2 may indicate a frame of the watch.

The pixels PX are not disposed in the first and second non-display areas NDA1 and NDA2 to not display any image therein. However, printed layers having a predetermined color may be disposed in the first and second non-display areas NDA1 and NDA2 of the display panel 110 to display a specific color in the first and second non-display areas NDA1 and NDA2.

For example, although not illustrated, a printed layer including an organic material having black color may be disposed in the first and second non-display areas NDA1 and NDA2 to display black color in the first and second non-display areas NDA1 and NDA2.

However, the inventive concept is not limited thereto. For example, printed layers having a variety of colors may be disposed in the first and second non-display areas NDA1 and NDA2 of the display panel 110 to display a variety of colors in the first and second non-display areas NDA1 and NDA2. Also, the printed layers having different colors may be respectively disposed in the first and second non-display areas NDA1 and NDA2 to display different colors from each other in the first and second non-display area NDA1 and NDA2.

In an embodiment, where a size of the second non-display area NDA2 is decreased, a size of the display area DA may be increased, such that a larger image may be provided to a user.

Unlike embodiments of the present inventive concept, scan lines which extend in a row direction and data lines which extend in a column direction may be disposed on a display panel having a circular shape, and where a first scan driver is disposed in a first non-display area of the display panel, scan lines and data lines may be extended to detour the first non-display area of the display panel.

Unlike embodiments of the present inventive concept, if the scan lines and the data lines are disposed to detour the first non-display area, the scan lines and the data lines may further extend to a second non-display area by the area required to detour the first non-display area, and thus the second non-display area, which may be a bezel area, is increased. Also, the bezel area may be further increased where a data driver is disposed in the second non-display area.

However, in one or more embodiments of the present inventive concept, the data lines DL1 to DLn extend in a circular shape, the first scan lines SL1_1 to SL1_m extend in a radial shape, and the second scan lines SL2_1 to SL2_k are disposed between first scan lines of the first scan lines SL1_1 to SL1_m that are adjacent to each other. Also, the data driver 140 is disposed on the rear surface of the display panel 110. Thus, a size of the bezel area, which is the second non-display area NDA2, may be decreased.

As a result, the display apparatus 100 according to one or more embodiments of the present inventive concept may have a circular shape and a reduced bezel area.

As described above, a display apparatus according to one or more embodiments of the present inventive concept may have a circular shape, extend data lines in a circular shape, extend scan lines in a radial shape, and reduce a bezel area by disposing a data driver on the rear surface of a display panel.

While this disclosure has been particularly shown and described with reference to some exemplary embodiments thereof, it will be understood by those skilled in the art that various changes in form and details may be made therein without departing from the spirit and scope of the disclosure as defined by the appended claims and equivalents thereof.

What is claimed is:

1. A display apparatus comprising:
    a plurality of first scan lines which extend in a radial direction;
    a plurality of second scan lines between adjacent first scan lines of the plurality of first scan lines which are adjacent to each other;
    a plurality of data lines which extend in a circular direction and intersect with the first and second scan lines; and a plurality of pixels in an area partitioned by the first scan lines, the second scan lines, and the data lines, the plurality of pixels being connected to the first scan lines, the second scan lines, and the data lines, wherein the second scan lines extend to be parallel with one of the adjacent first scan lines.

2. The display apparatus of claim 1, wherein respective lengths of the second scan lines decrease in a direction toward the other one of the adjacent first scan lines.

3. The display apparatus of claim 1, further comprising a display panel having a circular shape and on which the first and second scan lines, the data lines, and the pixels are arranged.

4. The display apparatus of claim 3, wherein an area of the display panel as viewed in a plane comprises:
- a first non-display area in a central region of the display panel;
- a second non-display area in an outer region of the display area; and
- a display area, in which the pixels are arranged, between the first non-display area and the second non-display area.

5. The display apparatus of claim 4, wherein a number of pixels in the display area increases in a direction toward the second non-display area.

6. The display apparatus of claim 4, further comprising:
- a first scan driver in the first non-display area to be connected to the first scan lines;
- a second scan driver in the second non-display area to be connected to the second scan lines; and
- a data driver on a rear surface of the display panel to be connected to the data lines.

7. The display apparatus of claim 6, wherein the first and second scan drivers apply a plurality of scan signals to the first and second scan lines, and the data driver applies a plurality of data voltages to the data lines.

8. The display apparatus of claim 7, wherein the pixels comprise organic light-emitting elements which receive the data voltages in response to the scan signals and display an image corresponding to the received data voltages.

9. The display apparatus of claim 6, further comprising a plurality of first pads corresponding to the data lines, wherein one side of each of the data lines is connected to a corresponding first pad of the plurality of first pads, and another side of each of the data lines is adjacent to the corresponding first pad.

10. The display apparatus of claim 9, further comprising:
- a plurality of second pads on the rear surface of the display panel and connected to the first pads; and
- a plurality of connection lines on the rear surface of the display panel to connect the second pads and the data driver to each other.

11. The display apparatus of claim 10, wherein the display panel further comprises a first substrate including a plurality of via-holes overlapping the first and second pads, and the first and second pads are electrically connected to each other through the via-holes.

12. The display apparatus of claim 4, further comprising a printed layer in the first and second non-display areas and having a color.

13. The display apparatus of claim 12, wherein the printed layer in the first non-display area has the same color as the printed layer in the second non-display area.

14. The display apparatus of claim 12, wherein the printed layer in the first non-display area has a different color from the printed layer in the second non-display area.

15. The display apparatus of claim 1, wherein the second scan driver surrounds the display area.

* * * * *